(12) United States Patent
Lovett et al.

(10) Patent No.: US 7,285,986 B2
(45) Date of Patent: Oct. 23, 2007

(54) HIGH SPEED, LOW POWER CMOS LOGIC GATE

(75) Inventors: Simon J. Lovett, Boise, ID (US); Dean D. Gans, Nampa, ID (US); Larren G. Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 11/207,806

(22) Filed: Aug. 22, 2005

(65) Prior Publication Data
US 2007/0040585 A1 Feb. 22, 2007

(51) Int. Cl.
*H03K 19/096* (2006.01)
(52) U.S. Cl. .................. 326/95; 326/98; 365/203
(58) Field of Classification Search .............. 326/95, 326/96, 97, 98, 121, 55; 365/203
See application file for complete search history.

(56) References Cited

U.S. PATENT DOCUMENTS

| | | | |
|---|---|---|---|
| 4,041,326 A | 8/1977 | Robinson | |
| 4,160,919 A | 7/1979 | Curtice | |
| 4,207,476 A | 6/1980 | Upadhyayula | |
| 4,484,091 A | 11/1984 | Nagano | |
| 4,626,711 A | 12/1986 | Li | |
| 4,713,790 A | 12/1987 | Kloker et al. | |
| 4,718,035 A | 1/1988 | Hara et al. | |
| 4,870,305 A | 9/1989 | Rocchi | |
| 5,117,133 A | 5/1992 | Luebs | |
| 5,334,888 A | 8/1994 | Bodas | |
| 5,523,707 A | 6/1996 | Levy et al. | |
| 5,576,637 A | 11/1996 | Akaogi et al. | |
| 5,736,868 A | 4/1998 | Kim et al. | |
| 6,081,130 A | 6/2000 | Cao et al. | |
| 6,137,309 A | 10/2000 | Couteaux et al. | |
| 6,335,639 B1 | 1/2002 | Aingaran | |
| 6,356,112 B1 | 3/2002 | Tran et al. | |
| 6,437,602 B1 * | 8/2002 | Friend et al. ............. | 326/93 |
| 6,469,541 B2 | 10/2002 | Tran et al. | |
| 6,727,728 B1 | 4/2004 | Bitting | |

FOREIGN PATENT DOCUMENTS

JP 60233932 A * 11/1985

OTHER PUBLICATIONS

Dongwoo Lee, David Blaauw, *Static Leakage Reduction Through Simultaneous Threshold Voltage and State Assignment*, pp. 191-194, Jun. 2-6, 2003.

(Continued)

*Primary Examiner*—Daniel Chang
(74) *Attorney, Agent, or Firm*—Dickstein Shapiro LLP

(57) ABSTRACT

A logic gate with a differential evaluation stage, precharge circuitry for precharging outputs of the gate, latch circuitry for latching the outputs and an inverter. The gate uses high speed, low threshold voltage devices in the evaluation stage, yet uses higher threshold voltage devices in other portions of the gate (e.g., precharge circuitry). This use of dual threshold voltage devices minimizes power consumption while maximizing speed. During standby mode, the gate is operated in an evaluation mode to substantially mitigate standby current.

43 Claims, 4 Drawing Sheets

OTHER PUBLICATIONS

Yibin Ye, Shekhar Borkar and Vivek De, *A New Technique for Standby Leakage Reduction in High-Performance Circuits*, 1998 Symposium on VLSI Circuits Digest of Technical Papers, pp. 40-41, Aug. 1998.

Tanay Karnik, Yibin Ye, James Tschanz, Liqiong Wei, Steven Burns, Venkatesh Govindarajulu, Vivek De, and Shekhar Borkar, *Total Power Optimization by Simultaneous Dual-Vt Allocation and Device Sizing in High Performance Microprocessors*, pp. 486-491, Jun. 10-14, 2002.

Chulwoo Kim, Ki-Wook Kim, and Sung-Mo Kang, *Energy-Efficient Skewed Static Logic With Dual Vt: Design and Synthesis*, IEEE Transactions on Very Large Scale Integration (VLSI) Systems, vol. 11, No. 1 Feb. 2003, pp. 64-70.

Jyh-Ming Wang, Sung-Chuan Fang, and Wu-Shiung Feng, *New Efficient Designs for XOR and XNOR Functions on the Transistor Level*, IEEE Journal of Sold-State Circuts, vol. 29, No. 7, Jul. 1994, pp. 780-786.

* cited by examiner

HIGH SPEED, LOW POWER CMOS LOGIC GATE

FIELD OF THE INVENTION

The present invention relates generally to complimentary metal oxide semiconductor (CMOS) logic gates. More specifically, the present invention relates to CMOS exclusive-OR (XOR) gates that have increased speed and reduced power consumption.

BACKGROUND OF THE INVENTION

Conventional CMOS logic gates may be categorized as either static or dynamic gates. In static gates, the actual input logic signals cause the gate to switch. Clocked signals such as set or reset signals are not required in a static gate. On the other hand, dynamic gates require a set or reset signal and accompanying logic. Dynamic gates are often faster than static gates. However, additional complexities associated with clocked inputs and power consumption must be overcome in dynamic gates. For example, clocked input gates require synchronized inputs and generally consume more power than static gates.

Challenges associated with dynamic logic gates are especially evident in CMOS exclusive-OR (XOR) gates. Compared with other basic logic gates, conventional CMOS XOR gates are slow and power-hungry. Conventional CMOS XOR gates contain a large number of transistors. The resultant large circuit footprint and fan-out, which affect input timing for successive XOR stages, causes relatively slow circuit speeds. Additionally, the large size of the CMOS transistors used in an XOR gate, coupled with the large fan-out, creates a large amount of capacitance that must be switched each time the XOR gate switches. The switching of large capacitance increases power consumption and also results in relatively slow XOR gate switching.

A type of dynamic XOR gate is a precharge/evaluate gate. In precharge/evaluate gates, gate outputs are charged during a precharge mode prior to evaluation of the logic input signals during an evaluation mode. Typically, a precharge unit includes at least one of a class of transistors (for example, a PMOS transistor) such that the precharge unit turns on when the associated clock signal is either high or low (a PMOS transistor, for example, will turn on when the input clock signal switches low). In contrast, an evaluation unit includes transistors that are off when the precharge transistors are on. For example, if the precharge transistors were PMOS transistors, the evaluate transistors would be NMOS transistors that would turn on when the input clock signal switched high. Thus, when the precharge/evaluate XOR gate is in the precharge mode, outputs from the evaluation unit are set "high" and the evaluation unit is not active (because the evaluation transistors are not on). When the clock signal transitions to a low state, the precharge unit turns off and the evaluation unit turns on allowing the evaluation unit to output the result of the logic operation.

One challenge associated with precharge/evaluate XOR gates is that XOR gates are often linked together in a chain of successive XOR gates. Setting the outputs of a linked evaluation unit high could erroneously provide input to another XOR gate in the chain.

An additional challenge in implementing a precharge/evaluate gate is minimizing power consumption during a standby mode. For example, DRAM (dynamic random access memory) memory devices typically have a low-power or standby specification requiring the DRAM to operate within a maximum current during a low-power or standby mode. Since DRAM memory cells must be refreshed during the lower-power or standby mode, reducing the frequency of the refresh operations will improve the DRAM's operational performance for the mode. During a standby mode, a precharge/evaluation XOR gate is inactive and ideally has a zero standby current (and hence, zero power consumption). However, in reality, various leak currents across the transistors in the XOR gate combine to result in significant power consumption even though the logic gate is "inactive." In response to the undesired power drain, conventional XOR gates have utilized large external p-channel local regulator devices for the purpose of bringing the gate standby current $I_{off}$ to near zero. Using large p-channel local regulator devices compromises circuit speed, however, as a result of the resultant decrease in overall power supply voltage.

Thus, an XOR gate with efficient switching speeds and low power consumption is desirable. An XOR gate that implements an efficient method of reducing standby current is also desirable.

BRIEF SUMMARY OF THE INVENTION

The present invention provides a CMOS logic gate (e.g., an XOR gate) with efficient switching speeds and low power consumption.

The present invention also provides a CMOS logic gate (e.g., an XOR gate) that implements an efficient method of reducing standby current.

The above and other features and advantages are achieved in various exemplary embodiments of the invention by providing a logic gate with a differential evaluation stage, precharge circuitry for precharging outputs of the gate, latch circuitry for latching the outputs and an inverter. The gate uses high speed, low threshold voltage devices in the evaluation stage, yet uses higher threshold voltage devices in other portions of the gate (e.g., precharge circuitry). This use of dual threshold voltage devices minimizes power consumption while maximizing speed. During standby mode, the gate is operated in an evaluation mode to substantially mitigate standby current.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

The present invention is now described in more detail with respect to various exemplary embodiments. This is for convenience only and is not intended to limit the application of the present invention.

Figure 1:
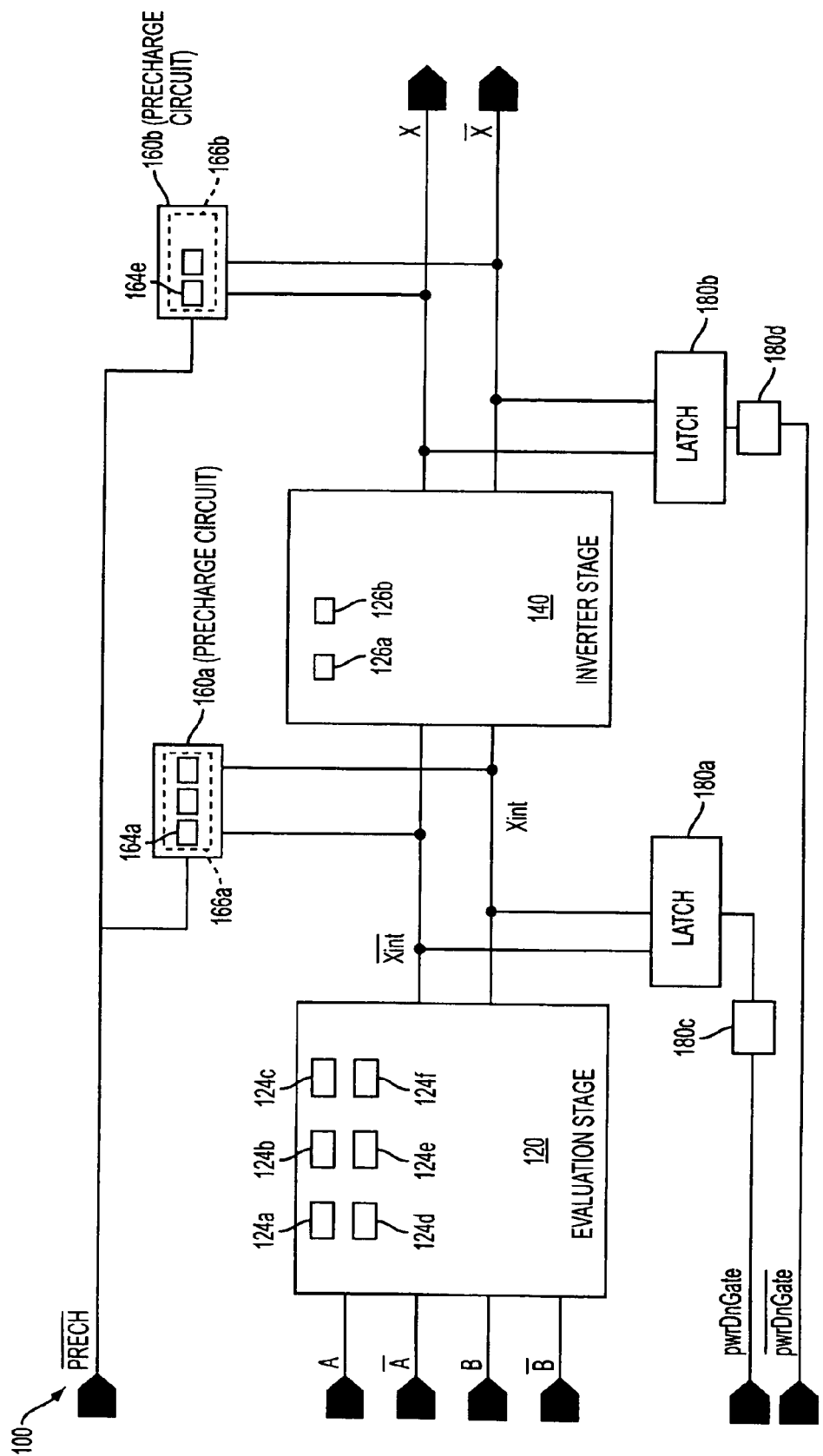
FIG. 1 is a block diagram of a logic gate constructed in accordance with an exemplary embodiment of the invention.
Figure 2:
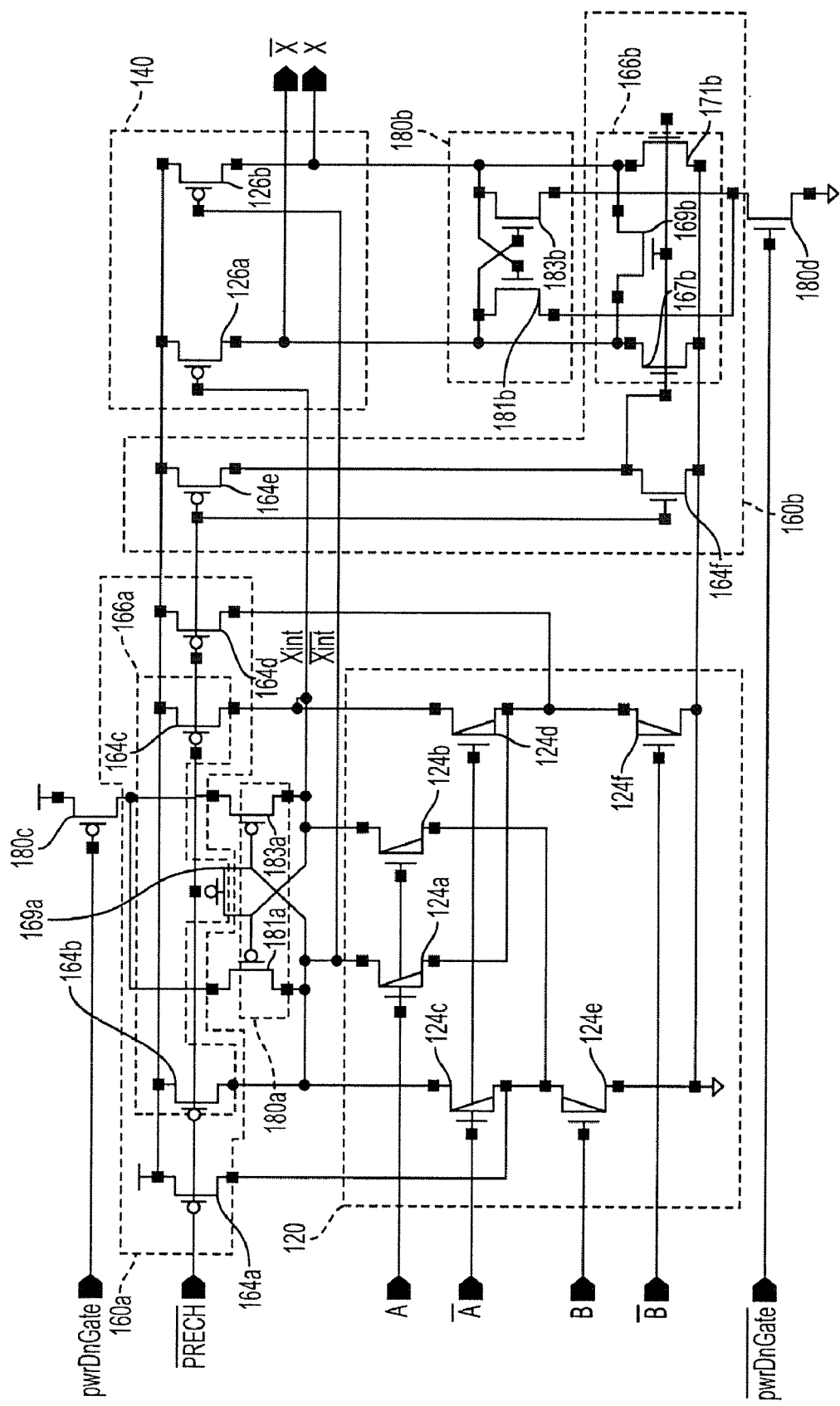
FIG. 2 is an exemplary electrical schematic of the logic gate illustrated in FIG. 1.

FIG. 1 is a block diagram of logic gate constructed in accordance with the invention. FIG. 2 is a schematic illustration of the FIG. 1 logic gate. According to FIGS. 1 and 2, the illustrated embodiment is an XOR gate 100 comprising an XOR evaluation stage 120, an inverter stage 140, two precharge circuits 160a, 160b, two latches 180a, 180b, and two power down enable gates 180c, 180d.

According to the illustrated embodiment, the evaluation unit 120 comprises multiple n-channel transistors 124a, 124b, 124c, 124d, 124e, 124f. The inverter 140 comprises two p-channel transistors 126a, 126b. The first precharge unit 160a comprises p-channel transistors 164a, 164b, 164c, 164d, 169a. The second precharge unit 160b comprises p-channel transistor 164e and n-channel transistors 164f, 167b, 169b, 171b. The first latch comprises cross-coupled p-channel transistors 181a, 183a, while the second latch comprises cross-coupled n-channel transistors 181b, 183b. It should be appreciated that the enable gates 180c, 180d could be part of the latches 180a, 180b, respectively, if so desired.

The XOR evaluation stage 120 accepts inputs A, B, /A, /B. The XOR evaluation stage 120 performs an XOR operation on the inputs A, B, /A, /B to obtain XOR evaluation stage outputs Xint, /Xint. The inverter stage 140 inverts the evaluation stage outputs Xint, /Xint to generate two XOR gate outputs X, /X.

To maximize circuit speed and minimize power, the XOR gate 100 utilizes dual voltage threshold devices. That is, some of the transistors are low threshold devices, while others are high threshold devices. Each has its own benefits, as is described blow. The transistors 124a, 124b, 124c, 124d, 124e, 124f within the XOR evaluation stage 120 and the transistors 126a, 126b within the inverter 140 are high speed, low-voltage transistors (i.e., low threshold devices). The high speed low-voltage transistors 124a, 124b, 124c, 124d, 124e, 124f, 126a, 126b have high switching speed, and are thus, effective at maximizing circuit speed. However, high speed, low-voltage transistors generally have high leak currents; accordingly, the use of the high speed, low-voltage transistors 124a, 124b, 124c, 124d, 124e, 124f, 126a, 126b is limited to circuit regions where the leak current can be substantially minimized and/or controlled.

In contrast, high speed is not critical in the precharge units 160a, 160b. Consequently, the precharge units 160a, 160b utilize conventional low speed high-voltage CMOS transistors 164a, 164b, 164c, 164d, 169a, 164e, 164f, 167b, 169b, 171b (i.e., high threshold devices). The result of using dual (i.e., two types of) threshold voltage devices is that circuit speed is maximized through the XOR evaluation stage 120 and the inverter stage 140 where leak currents may be managed (as will be explained below). Leak currents and hence power consumption are also minimized in the precharge units 160a, 160b by the use of conventional CMOS transistors 164a, 164b, 164c, 164d, 169a, 164e, 164f, 167b, 169b, 171b.

The precharge units 160a, 160b, activated by a precharge activating signal /PRECH, precharge the outputs of the XOR evaluation stage 120 and the outputs of the inverter stage 140. When activated by the precharge activating signal /PRECH, the first precharge unit 160a precharges the outputs of the XOR evaluation stage 120 (i.e., outputs Xint, /Xint). When activated by the precharge activating signal /PRECH, the second precharge unit 160b precharges the inverter 140 outputs X, /X to a state opposite the state of the precharged outputs Xint, /Xint. For example, if the first precharge unit 160a is configured to precharge outputs Xint, /Xint to a high state, then the second precharge unit 160b is configured to precharge outputs X, /X to a low state.

The precharge units 160a, 160b respectively include three-transistor equalization networks 166a, 166b. In the first precharge unit 160a, the equalization network 166a comprises transistors 164b, 169a, 164c. In the second precharge unit 160b, the equalization network 166b comprises transistors 167b, 169b, 171b. The three-transistor equalization networks 166a, 166b take advantage of the complementary state outputs Xint, /Xint, X, /X to quickly precharge the complementary state outputs Xint, /Xint, X, /X. For example, when outputs X, /X are not precharged, one of the outputs X, /X is high and the other is low. When activated, the second precharge unit 160b will pull one of the outputs X, /X to an opposite state. In the example given above, both outputs X, /X are precharged low; thus, only one of the outputs X, /X must be pulled low since the other output is already low. Although a single transistor can be used, a faster equalization method is achieved by using the networks 166a, 166b, which initially equalize the complementary outputs Xint, /Xint, X, /X and then pull the outputs to the desired precharged state (i.e., low, in the described).

The latches 180a, 180b are cross-coupled CMOS transistors respectively located at the outputs of the XOR evaluation stage 120 and the inverter stage 140. The cross-coupled latches 180a, 180b are used to hold the outputs at a sufficient voltage potential. Without the cross-coupled latches 180a, 180b, the complementary outputs Xint, /Xint, X, /X could float resulting in potentially erroneous logic outputs.

The latches 180a, 180b are also used to substantially mitigate any standby current in the XOR gate 100. Mitigating the standby current is particularly desirable in e.g., low-voltage mobile devices. In low power DRAM memories for wireless applications, low power and high speed operations are required. Error correction is a technique that can substantially reduce standby current by substantially increasing the refresh rate of the DRAM. The basic component of the error correction block is the XOR gate. In order to mitigate the standby current, the XOR gate 100 is forced into an evaluate mode when the gate 100 is in the standby mode. Although having the XOR gate 100 in evaluate mode when the gate is in standby serves no functional purpose (since the XOR gate 100 output is a logical "don't care"), it does allow the XOR gate 100 to enter a near zero leakage mode. Typically, when the XOR gate 100 is in evaluate mode, the latches 180a, 180b hold their respective stage outputs steady by tying the outputs to a constant voltage level. However, this creates a voltage differential, and various leak currents are generated across the transistors. When the XOR gate 100 is in standby mode, however, and the stage outputs are a logical "don't care," there is no need to tie the outputs to a constant voltage source. Instead, when XOR gate 100 is in standby, power-down signals pwrDnGate, /pwrDnGate are used to decouple the cross-coupled latches 180a, 180b from the respective constant voltage levels used by the latches 180a, 180b.

The XOR gate 100 includes an integrated inverter stage 140 instead of an external inverter as is used in conventional XOR gates. The integrated inverter stage 140 improves fan-out by providing a built-in driver stage in place of an external component. An integrated inverter stage 140 also allows close coupling of the precharge and evaluate timing signals (discussed below with respect to FIG. 3), thus facilitating the successful achievement of design margins.

To further maximize circuit speed in the XOR evaluation stage 120, load balancing is used in sizing the input stack devices such that all of the logic gate inputs have identical gate capacitance loading. By ensuring equal loads across all inputs to the XOR evaluation stage 120, propagation delays across all circuit paths are equalized.

Figure 3:
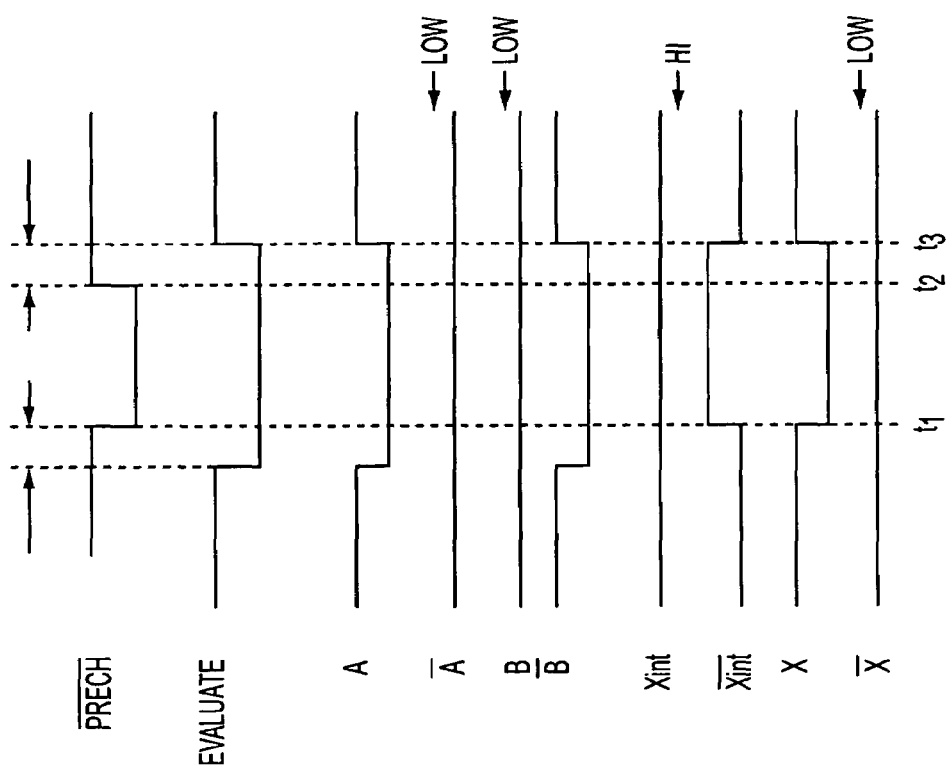
FIG. 3 is a timing diagram for the logic gate of FIG. 1, according to an embodiment of the invention.

An exemplary timing diagram for the XOR gate 100 is illustrated in FIG. 3. At time t1, the XOR gate 100 enters a precharge mode when the precharge activating signal /PRECH transitions low. In the precharge mode, as explained above, the XOR evaluation stage outputs Xint, /Xint are precharged to a high level and the inverter stage outputs X, /X are precharged to a low level. The XOR gate inputs A, /A, B, /B are presumably precharged low by the precharging of previous logic gate outputs. Upon entering an evaluation mode at time t3 (after time t2 when the precharge activating signal /PRECH transitions high), the inputs A, /A, B, /B are allowed to resume their complementary states, and the complementary outputs Xint, /Xint, X, /X are shifted to reflect the XOR and inverter logical operations.

In FIG. 3, the high level of the evaluate signal EVALUATE indicates when the evaluate mode is active. It should be appreciated that FIGS. 1 and 2 do not illustrate the evaluate signal EVALUATE since the evaluate signal EVALUATE is not required to practice the invention. The evaluate signal EVALUATE corresponds to the transitioning of the precharge activating signal /PRECH. That is, when the precharge activating signal /PRECH is at a logic high level, the precharge activating signal /PRECH does not activate the precharge mode; instead, the precharge activating signal /PRECH can be used to activate the evaluation mode (when the power-down signals pwrDnGate, /pwrDnGate are not being used to float the outputs Xint, /Xint, X, /X).

The basic gate design presented in FIG. 1 can be extended to other logic functions as well, such as NAND and NOR gates. Specifically, a precharge/evaluate style gate design may be applied, utilizing three-transistor equalizing precharge networks, dual threshold voltage devices, integrated inverter stages, balanced input loading and cross-coupled latches that guarantee complementary outputs for an active evaluate path but also allow floating outputs and near zero standby current during a standby mode. The logic gate may also be extended to more than two inputs (e.g., three or more inputs).

Figure 4:
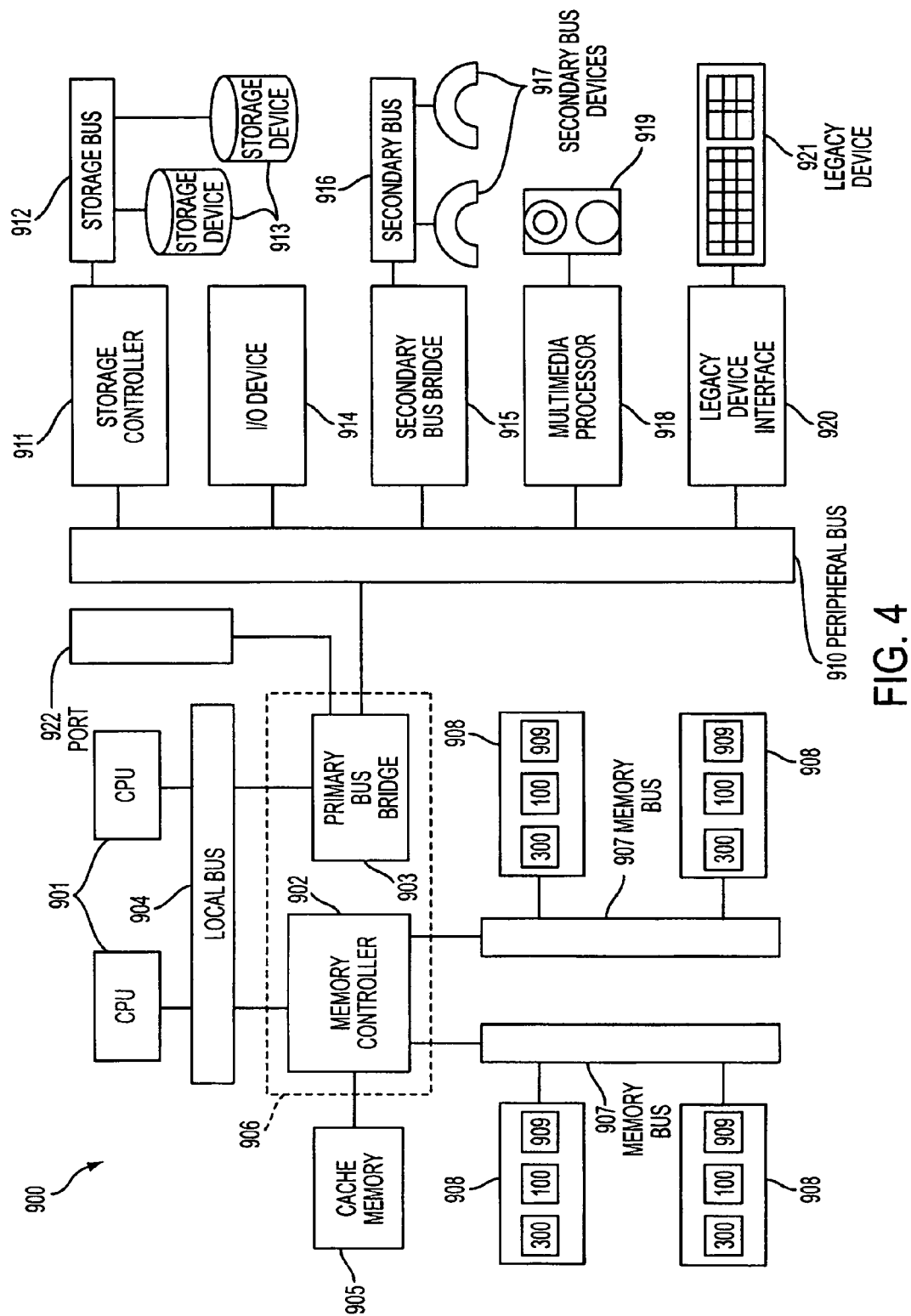
FIG. 4 is a block diagram of a processor system incorporating at least one logic gate constructed in accordance with an embodiment of the invention.

FIG. 4 shows a processor system 900 that may utilize a memory device 908 incorporating one of the embodiments of the invention (i.e., XOR gate 100 of FIGS. 1, 2), in accordance with the invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one XOR gate 100 of the present invention. Memory component 908 may also include a DRAM memory device 300 which may contain its own XOR gate 100 or may be connected to the XOR gate 100 of the invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge 915 may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices 921, for example, older styled keyboards and mice, to the processing system 900.

The processing system 900 illustrated in FIG. 4 is only an exemplary processing system that may use the memory devices of the invention. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

It should be appreciated that the invention encompasses a method of fabricating the XOR gate 100 of FIGS. 1 and 2 as part of an integrated circuit. Accordingly, the invention may comprise the integrated circuit fabrication acts of fabricating an evaluation unit having first and second pairs of inputs, said evaluation unit performing a logic operation on said first and second pairs and outputting a first pair of outputs during an evaluation mode, fabricating an inverter coupled to and inverting said first pair of outputs and outputting a second pair of outputs corresponding to said inverted first pair of outputs, and fabricating first and second precharge units, said first precharge unit being configured to precharge the first pair of outputs to a first predetermined voltage level during a precharge mode, and the second precharge unit being configured to precharge the second pair of outputs to a second predetermined voltage level during the precharge mode.

Although an exemplary embodiment of the invention has been shown, a person of ordinary skill in the art would recognize that the invention is not limited to the specific illustrated hardware implementation. The invention may be implemented in either hardware, software or any combination thereof.

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above-described exemplary embodiments.

What is claimed as new and desired to be protected by Letters Patent of the United States is:

1. A logic gate, comprising:
an evaluation unit having first and second pairs of inputs, said evaluation unit performing a logic operation on said first and second pairs and outputting a first pair of outputs during an evaluation mode;
an inverter coupled to and inverting said first pair of outputs and outputting a second pair of outputs corresponding to said inverted first pair of outputs; and
first and second precharge units, said first precharge unit being configured to precharge the first pair of outputs to a first predetermined voltage level during a precharge mode, and the second precharge unit being configured to precharge the second pair of outputs to a second predetermined voltage level during the precharge mode.

2. The logic gate of claim 1, further comprising:
first and second latches, said latches being respectively configured to hold the values of the first and second pairs of outputs during the evaluation mode.

3. The logic gate of claim 2, wherein said latches are configured to allow said first and second pairs of outputs to float during a standby mode.

4. The logic gate of claim 2, wherein said latches comprise a pair of cross-coupled transistors, and said logic gate further comprises first and second enable gates for enabling said first and second latches in response to first and second latching control signals.

5. The logic gate of claim 1, wherein said evaluation unit is active when the logic gate is in a standby mode.

6. The logic gate of claim 1, wherein said first pair of inputs comprises a first complementary pair of inputs and said second pair of inputs comprises a second complementary pair of inputs.

7. The logic gate of claim 6, wherein said first pair of outputs comprises a first complementary pair of outputs and said second pair of outputs comprises a second complementary pair of outputs.

8. The logic gate of claim 1, wherein said logic operation is an exclusive-OR operation.

9. The logic gate of claim 1, wherein said logic operation is a NOR operation.

10. The logic gate of claim 1, wherein said logic operation is a NAND operation.

11. The logic gate of claim 1, wherein said first precharge unit comprises a first equalization network and said second precharge unit comprises a second equalization network.

12. The logic gate of claim 11, wherein said first equalization circuit comprises a first network of at least three transistors configured to pull one output of said first pair of outputs to a logic level of the other output of said first pair of outputs during the precharge mode.

13. The logic gate of claim 12, wherein said second equalization circuit comprises a second network of at least three transistors configured to pull one output of said second pair of outputs to a logic level of the other output of said second pair of outputs during the precharge mode.

14. The logic gate of claim 13, wherein the transistors in the first and second networks operate at a first threshold voltage and transistors in said evaluation unit operate at a second, different threshold voltage.

15. The logic gate of claim 1, wherein said inverter, said precharge units and said evaluation unit reside in the same integrated circuit.

16. A processor system comprising:
a processor; and
a circuit comprising a logic gate coupled to said processor, said logic gate comprising:
an evaluation unit having first and second pairs of inputs, said evaluation unit performing a logic operation on said first and second pairs and outputting a first pair of outputs during an evaluation mode,
an inverter coupled to and inverting said first pair of outputs and outputting a second pair of outputs corresponding to said inverted first pair of outputs, and
first and second precharge units, said first precharge unit being configured to precharge the first pair of outputs to a first predetermined voltage level during a precharge mode, and the second precharge unit being configured to precharge the second pair of outputs to a second predetermined voltage level during the precharge mode.

17. The system of claim 16, wherein said logic gate further comprises:
first and second latches, said latches being respectively configured to hold the values of the first and second pairs of outputs during the evaluation mode.

18. The system of claim 17, wherein said latches are configured to allow said first and second pairs of outputs to float during a standby mode.

19. The system of claim 17, wherein said latches comprise a pair of cross-coupled transistors, and said logic gate further comprises first and second enable gates for enabling said first and second latches in response to first and second latching control signals.

20. The system of claim 16, wherein said evaluation unit is active when the logic gate is in a standby mode.

21. The system of claim 16, wherein said first pair of inputs comprises a first complementary pair of inputs and said second pair of inputs comprises a second complementary pair of inputs.

22. The system of claim 21, wherein said first pair of outputs comprises a first complementary pair of outputs and said second pair of outputs comprises a second complementary pair of outputs.

23. The system of claim 16, wherein said logic operation is an exclusive-OR operation.

24. The system of claim 16, wherein said logic operation is a NOR operation.

25. The system of claim 16, wherein said logic operation is a NAND operation.

26. The system of claim 16, wherein said first precharge unit comprises a first equalization network and said second precharge unit comprises a second equalization network.

27. The system of claim 26, wherein said first equalization circuit comprises a first network of at least three transistors configured to pull one output of said first pair of outputs to a logic level of the other output of said first pair of outputs during the precharge mode.

28. The system of claim 27, wherein said second equalization circuit comprises a second network of at least three transistors configured to pull one output of said second pair of outputs to a logic level of the other output of said second pair of outputs during the precharge mode.

29. The system of claim 28, wherein the transistors in the first and second networks operate at a first threshold voltage and transistors in said evaluation unit operate at a second, different threshold voltage.

30. The system of claim 16, wherein said inverter, said precharge units and said evaluation unit reside in the same integrated circuit.

31. A method of operating a logic gate, said method comprising the acts of:
   precharging first and second pairs of outputs during a precharge mode;
   inputting first and second pairs of input during an evaluation mode;
   performing a logic operation on the first and second pairs of inputs to create a new first pair of outputs during the evaluation mode;
   inverting the new first pair of outputs to generate a new second pair of outputs; and
   floating at least one of the first and second pairs of outputs during a standby mode of operation.

32. The method of claim 31, further comprising the act of latching the new first and second pairs of outputs.

33. The method of claim 31, wherein the logic operation is an exclusive-OR operation.

34. The method of claim 31, wherein the logic operation is a NAND operation.

35. The method of claim 31, wherein the logic operation is a NOR operation.

36. The method of claim 31, wherein said precharging act comprises equalizing the first pair of outputs to a first logic level and equalizing the second pair of outputs to a second logic level.

37. The method of claim 36, wherein said act of equalizing the first pair of outputs comprises setting one output of said first pair of outputs to a logic level of the other of said first pair of outputs.

38. The method of claim 36, wherein said act of equalizing the second pair of outputs comprises setting one output of said second pair of outputs to a logic level of the other of said second pair of outputs.

39. The method of claim 31 further comprising the act of floating the first and second pairs of outputs during a standby mode of operation.

40. A method of fabricating a logic gate in an integrated circuit, said method comprising the integrated circuit fabrication acts of:
   fabricating an evaluation unit having first and second pairs of inputs, said evaluation unit performing a logic operation on said first and second pairs and outputting a first pair of outputs during an evaluation mode;
   fabricating an inverter coupled to and inverting said first pair of outputs and outputting a second pair of outputs corresponding to said inverted first pair of outputs; and
   fabricating first and second precharge units, said first precharge unit being configured to precharge the first pair of outputs to a first predetermined voltage level during a precharge mode, and the second precharge unit being configured to precharge the second pair of outputs to a second predetermined voltage level during the precharge mode.

41. The method of claim 40, further comprising the act of fabricating first and second latches, said latches being respectively configured to hold the values of the first and second pairs of outputs during the evaluation mode.

42. The method of claim 41, wherein said act of fabricating the latches comprises the acts of:
   fabricating first and second pairs of cross-coupled transistors; and
   fabricating first and second enable gates for enabling said first and second pair of cross-coupled transistors in response to first and second latching control signals.

43. The method of claim 40, wherein said act of fabricating the first and second precharge units comprises fabricating a first equalization network and a second equalization network.

* * * * *